(12) United States Patent
Lee

(10) Patent No.: US 7,883,020 B2
(45) Date of Patent: Feb. 8, 2011

(54) SMART CARD AND METHOD OF TESTING SMART CARD

(75) Inventor: Seung-Won Lee, Seongnam-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 476 days.

(21) Appl. No.: 11/763,856

(22) Filed: Jun. 15, 2007

(65) Prior Publication Data

US 2008/0093465 A1   Apr. 24, 2008

(30) Foreign Application Priority Data

Oct. 18, 2006   (KR) .................... 10-2006-0101427

(51) Int. Cl.
*G06K 19/06*   (2006.01)
(52) U.S. Cl. .................... 235/492; 714/718; 714/723
(58) Field of Classification Search .................... 235/492
See application file for complete search history.

(56) References Cited

U.S. PATENT DOCUMENTS

| | | | | |
|---|---|---|---|---|
| 4,813,024 A | * | 3/1989 | Lisimaque et al. ..... | 365/185.04 |
| 5,568,437 A | * | 10/1996 | Jamal .................... | 365/201 |
| 5,671,394 A | * | 9/1997 | Katsuta ................ | 711/164 |
| 5,841,786 A |   | 11/1998 | Keyes | |
| 7,278,078 B2 | * | 10/2007 | Hii et al. ............... | 714/733 |
| 2004/0236910 A1 | * | 11/2004 | Kozakai et al. .......... | 711/115 |

FOREIGN PATENT DOCUMENTS

| | | |
|---|---|---|
| JP | 1991-194799 | 8/1991 |
| JP | 11-066884 | 3/1999 |
| JP | 2002-267721 | 9/2002 |
| KR | 1997-705145 | 9/1997 |
| KR | 1020020017278 | 3/2002 |

* cited by examiner

*Primary Examiner*—Seung H Lee
*Assistant Examiner*—Tae Kim
(74) *Attorney, Agent, or Firm*—F. Chau & Associates, LLC

(57) ABSTRACT

A smart card includes a non-volatile memory, a CPU, and a plurality of pads. The non-volatile memory stores a test program. The CPU is released from a reset state in response to a test enable signal. The CPU executes the test program stored in the non-volatile memory based on predetermined flag information and stores a result of the test program in the non-volatile memory.

5 Claims, 4 Drawing Sheets

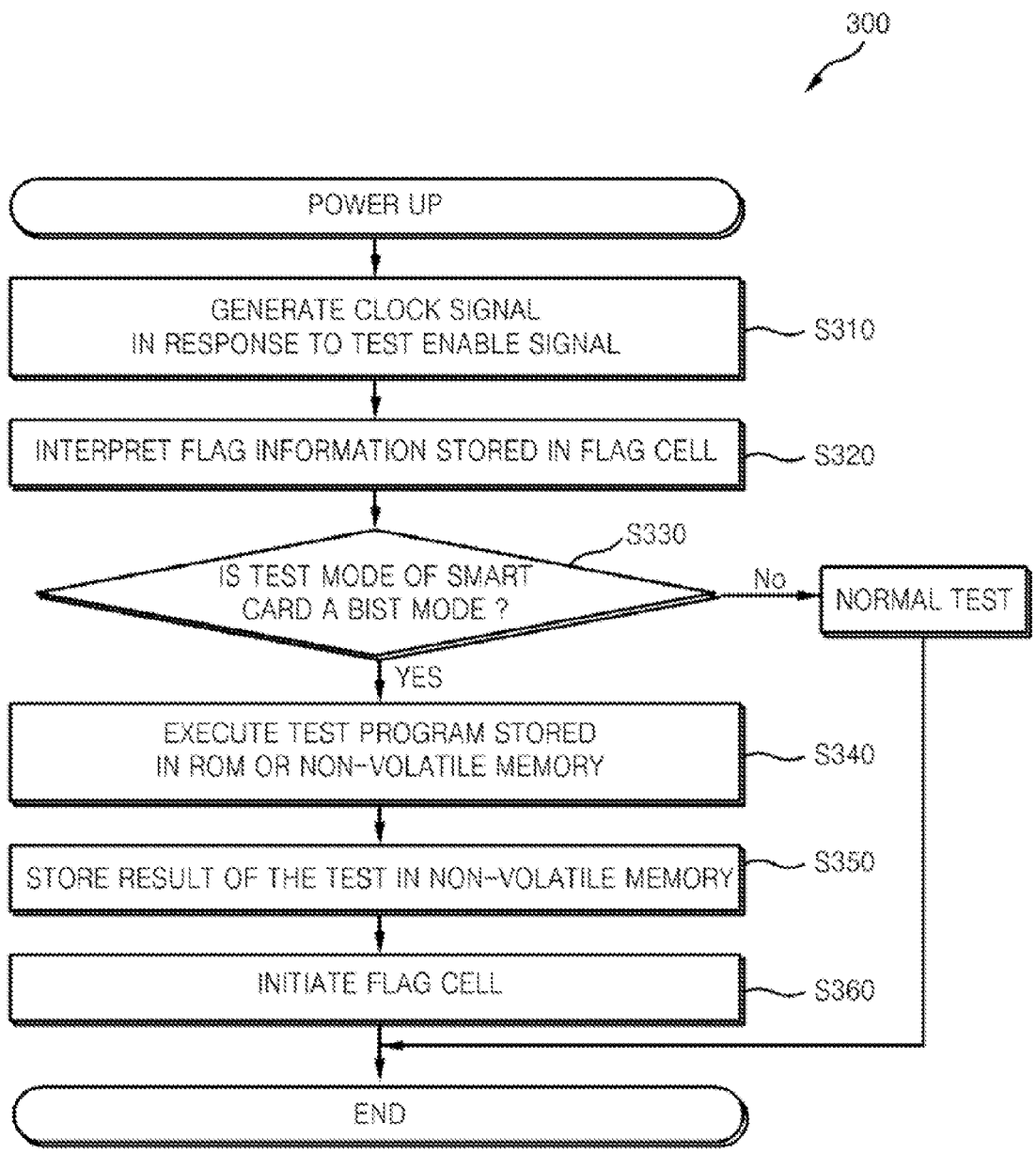

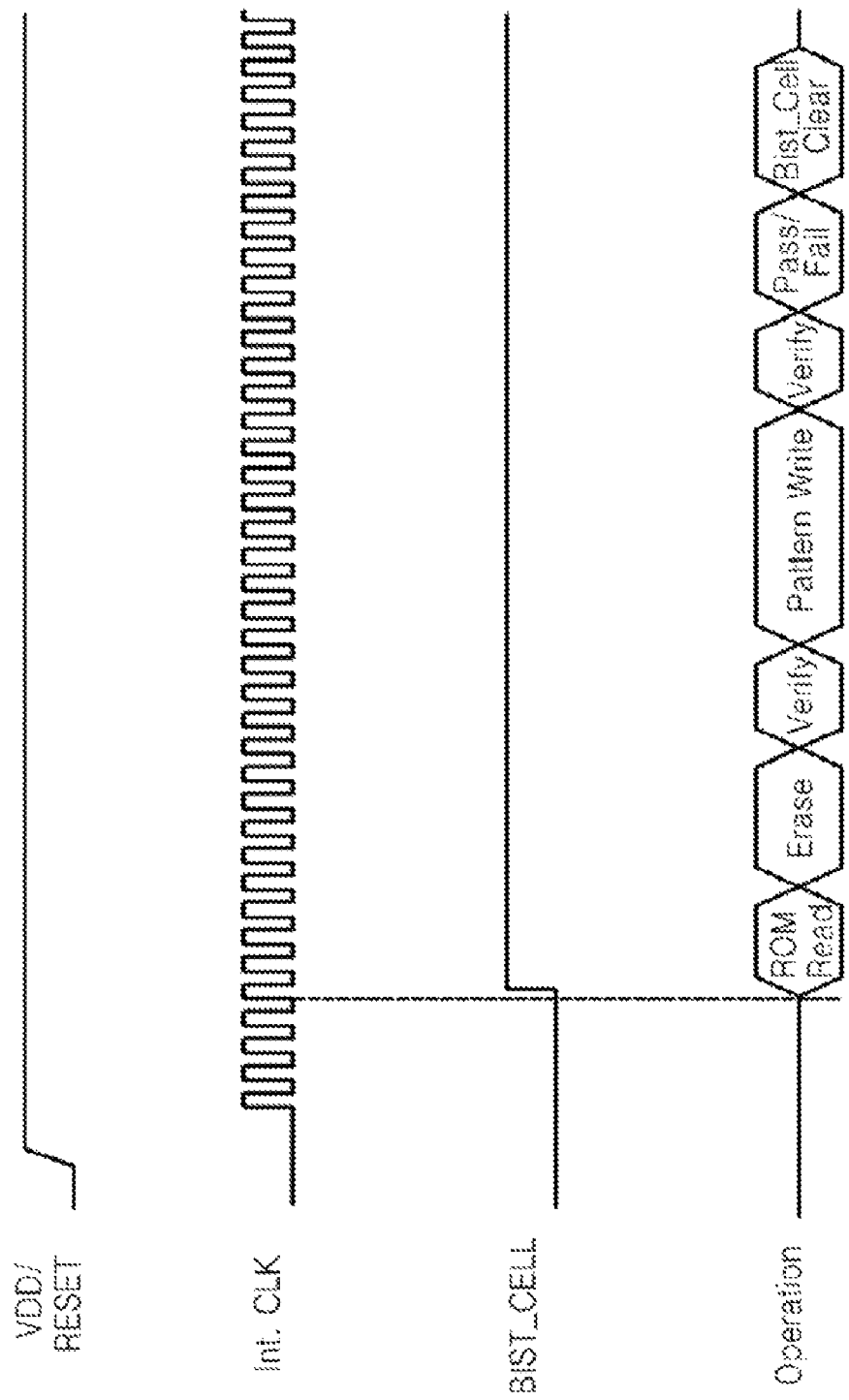

SMART CARD AND METHOD OF TESTING SMART CARD

CROSS-REFERENCE TO RELATED PATENT APPLICATION

This application claims priority to Korean Patent Application No. 2006-0101427, filed on Oct. 18, 2006, the disclosure of which is incorporated by reference herein in its entirety.

BACKGROUND OF THE INVENTION

1. Technical Field

The present disclosure relates to a smart card and a method of testing the smart card, and more particularly, to a smart card employing a BIST (built-in self test) scheme for increasing the number of smart cards that can be tested in parallel, and a method of testing the smart card.

2. Discussion of the Related Art

Testing a smart card may include a first step of testing an interface between the smart card and a host, a second step of testing an operation of a non-volatile memory, and a third step of testing operations of peripheral devices. For example, the peripheral devices may include a peripheral circuit, a volatile memory, a ROM, etc.

The second testing step may require more processing time than either of the first or third steps, because the capacity of the non-volatile memory greatly increases with high integration due to a segmentation of the non-volatile memory process.

Accordingly, it can be beneficial to reduce the testing time of the second testing step. Test performance can be improved by using a multi-parallel test to test a plurality of smart cards together in a tester.

However, as the capacity of the non-volatile memory increases, the time required to test the non-volatile memory greatly increases. Efforts have also been made to improve testing performance by increasing the number of channels of a tester. However, there is a limit to the number of channels a tester can be increased.

FIG. 1 is a block diagram of a conventional smart card 100. Referring to FIG. 1, the smart card 100 includes a bus 110, a plurality of pads 120, a peripheral circuit 130, a volatile memory such as RAM 140, a ROM 150, a non-volatile memory (NVM) 160, and a CPU 170. The smart card 100 receives testing signals (e.g., a ground voltage GND, a power supply voltage VDD, a reset signal RESET a clock signal CLK, a testing signal TEST, and a data signal DATA) input to the corresponding pads 120, and starts a testing operation.

When testing of the smart card 100 starts, the smart card 100 tests the non-volatile memory 160 in response to the received testing signals (e.g., the ground voltage GND, the power supply voltage VDD, the reset signal RESET, the clock signal CLK, the testing signal TEST, and the data signal DATA) and outputs the result(s) of the testing to a tester via an input/output (I/O) pad which is one of the pads 120.

A tester for testing the smart card 100 may control the testing signals by allocating as many channels as the number of testing signals which are required when testing the smart card 100. For example, the tester may control the testing signals by allocating at least 5-6 channels in testing the single smart card 100. As described above, there is a limit to increasing the number of channels in the tester, and thus the number of devices to practice the multi-parallel test in the smart card 100 is limited.

Thus, there is a need for a method of increasing the number of smart cards that can be tested according to the multi-parallel test that decreases the number of channels required by the tester.

SUMMARY OF THE INVENTION

According to an exemplary embodiment of the present invention, there is provided a smart card which includes a non-volatile memory and a central processing unit (CPU). The non-volatile memory stores a test program. The CPU is released from a reset state in response to a test enable signal which may be input through one of a plurality of pads. The CPU executes the test program stored in the non-volatile memory based on predetermined flag information, and the test result is recorded in the non-volatile memory.

The smart card may further include a clock generator that outputs a clock signal for driving the CPU in response to the test enable signal. The smart card may further include a flag cell that stores the predetermined flag information. The predetermined flag information may be used by the CPU to determine a test mode of the non-volatile memory. The test enable signal may be a power supply voltage. The test program may test the non-volatile memory in a BIST (built-in self test) mode. The non-volatile memory may be a flash electrically erasable and programmable ROM (EEPROM).

According to an exemplary embodiment of the present invention, there is provided a smart card which includes a first non-volatile memory, a second non-volatile memory and a CPU. The second non-volatile memory stores a test program. The CPU is released from a reset state in response to a test enable signal which may be input through one of a plurality of pads. The CPU executes the test program stored in the second non-volatile memory based on predetermined flag information. The CPU stores a result of the test in the first non-volatile memory.

The smart card may further include a clock generator that outputs a cock signal for driving the CPU in response to the test enable signal. The smart card may further include a flag cell that stores the predetermined flag information. The predetermined flag information may be used by the CPU to determine a test mode of the first non-volatile memory. The test enable signal may be a power supply voltage. The test program may test the first non-volatile memory in a BIST mode.

According to an exemplary embodiment of the present invention, there is provided a method of testing a smart card. The method includes receiving a test enable signal from a host, generating a clock signal in response to the test enable signal, reading and interpreting flag information stored in a flag cell in response to the clock signal; testing the non-volatile memory by executing a test program stored in the non-volatile memory based on the interpreted flag information, and storing the test result in the non-volatile memory.

The method may further include a step of clearing the flag information from the flag cell. The test enable signal may be a power supply voltage received via one of a plurality of pads. The clock signal may be output from a clock generator in response to the test enable signal. The test program may test the non-volatile memory in a BIST mode.

BRIEF DESCRIPTION OF THE DRAWINGS

FIG. 3 is a flowchart of a method of testing a smart card, according to an exemplary embodiment of the present invention; and FIG. 4 is a timing diagram illustrating a method of testing a smart card according to an exemplary embodiment of the present invention.

DETAILED DESCRIPTION OF EXEMPLARY EMBODIMENTS

Figure 1:
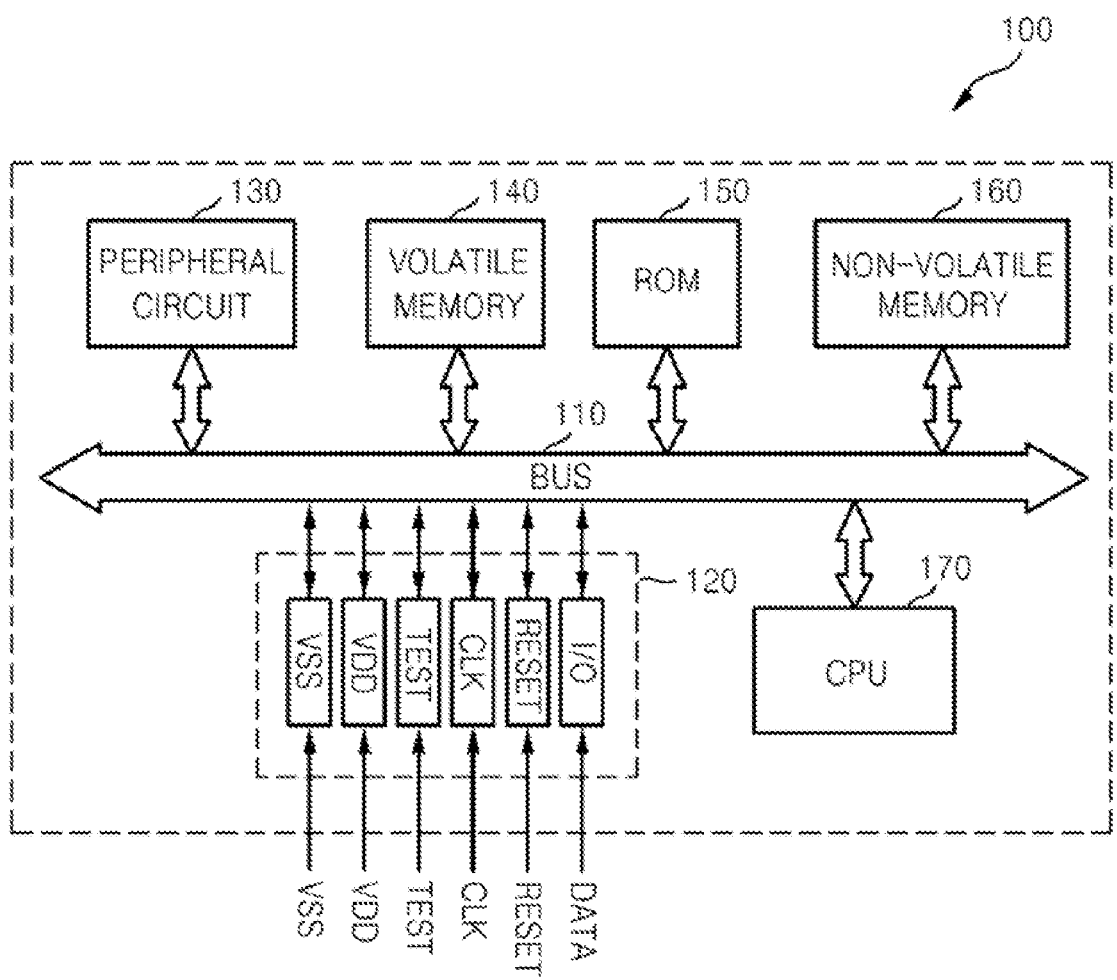
FIG. 1 is a block diagram of a conventional smart cards
Figure 2:
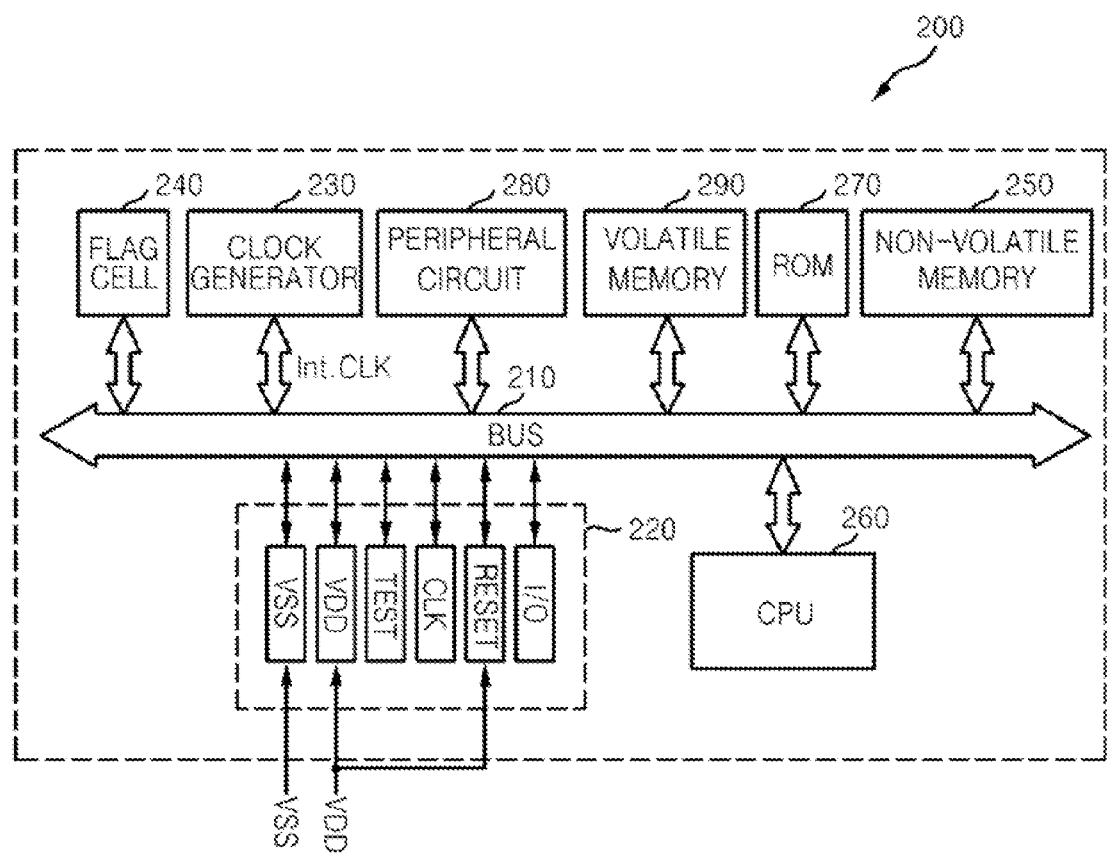
FIG. 2 is a block diagram of a smart card according to an exemplary embodiment of the present invention.

FIG. 2 is a block diagram of a smart card 200 according to an exemplary embodiment of the present invention. Referring to FIG. 2, the smart card (or memory card) 200 includes a bus 210, a plurality of pads 220, a clock generator 230, a flag cell 240, a non-volatile memory 250, and a CPU 260. The smart card 200 receives a test enable signal via one (e.g., a VDD pad) of the pads 220, is released from a reset state in response to the received test enable signal, and starts a test mode.

While it is preferred that the test enable signal be a power supply voltage VDD output from a tester, the present invention is not limited to the power supply voltage VDD. The clock generator 230 receives the test enable signal and outputs a clock signal Int.CLK for driving the CPU 260 in response to the test enable signal.

The flag cell 240 stores predetermined flag information for determining a test mode of the smart card 200, and outputs the flag information to the CPU 260 in response to a control signal of the CPU 260. The flag cell 240 stores flag information having a first level (i.e., a high level, "1") in a first testing step, i.e., in a step of testing an interface between the smart card and a host.

The flag cell 240 may be implemented within a peripheral circuit 280 or the non-volatile memory 250. The non-volatile memory 250 stores a testing program for testing the smart card 200. When a test of the non-volatile memory 250 of the smart card 200 has concluded, the CPU stores the results of the test in the non-volatile memory 250.

The non-volatile memory 250 may be implemented as a flash electrically erasable and programmable ROM (EEPROM). The CPU 260 is released from its reset state in response to the test enable signal and executes the testing program stored in the non-volatile memory 250 based on the clock signal Int.CLK and the predetermined flag information.

When the flag information stored in the flag cell 240 is set to a first level (i.e., a high level, or "1"), the CPU 260 determines that a test mode of the smart card 200 is set to a built-in self test (BIST) mode, and executes a test on the non-volatile memory 250 of the smart card 200. When the test on the non-volatile memory 250 has completed, the CPU 260 stores the result of the test in the non-volatile memory 250.

When the flag information stored in the flag cell 240 is set to a second level (i.e., a low level, or "0"), the CPU 260 determines that the test mode of the smart card 200 is a normal test mode. The normal test mode is a test mode where signals for testing the smart card 200 are received via channels allocated by an external tester.

Although the testing program has been described above as being stored in the non-volatile memory 250, the present invention is not limited thereto. For example, when the smart card 200 further includes a ROM 270, the test program may be stored in the ROM 270. When the test program is stored in the ROM 270, the non-volatile memory 250 can be tested using the test program stored in the ROM 270.

Although a method of testing the smart card 200 by using only one channel allocated by a tester has been described, the present invention is not limited thereto. For example, the smart card 200 may receive at least one of testing signals (e.g., a ground voltage GND, a power supply voltage VDD, a reset signal RESET, a clock signal CLK, a test signal TEST, and a data signal DATA) from the tester by increasing the number of channels allocated by the tester, and use the received testing signal upon a test of the smart card 200.

FIG. 3 is a flowchart of a method of testing a smart card, according to an exemplary embodiment of the present invention. FIG. 4 is a timing diagram illustrating the testing method shown in FIG. 3. The method of testing the smart card 200 will now be described with reference to FIGS. 2 through 4.

The smart card 200 receives the test enable signal via one (i.e., a VDD pad) of the pads 220, is released from a reset state in response to the received test enable signal, and starts a test mode. While it is preferred that the test enable signal be a power supply voltage VDD, the present invention is not limited to the power supply voltage VDD. When the smart card 200 is enabled, the clock generator 230 outputs the clock signal Int.CLK for driving the CPU 260 in response to the test enable signal in an operation S310.

In an operation S320, the CPU 260 reads and interprets the predetermined flag information stored in the flag cell 240 in response to the clock signal Int.CLK. When the predetermined flag information is set to a first level, a test mode of the smart card 200 is set to a BIST mode. When the predetermined flag information is set to a second level, the test mode of the smart card 200 is set to a normal test mode.

When the predetermined flag information is set to the first level, the smart card 200 executes the test program stored in the non-volatile memory 250 to execute a BIST mode in operations S330 and S340. When the flag information is set to the second level, the smart card 200 executes a normal test mode in which the test signals are received via channels allocated by the tester.

When the test has completed, the smart card 200 stores the result(s) of the test in the nonvolatile memory 250 in an operation S350. When the storage of the result of the test has completed, the smart card 200 clears the flag information (e.g., a first level) stored in the flag cell 240 in an operation S360. The flag information is cleared to test the smart card 200 in a normal test mode, which uses all of the pads 220, in the next testing step (i.e., a third testing step).

After the test using the BIST mode has concluded, the test result stored in the nonvolatile memory 250 is read and output to the tester in the next testing step (i.e., the third testing step), thereby determining whether the smart card 200 is functioning properly.

According to at least one embodiment of the present invention, the number of smart cards that can be tested according to a multi-parallel test can be increased by minimizing the number of channels allocated by a tester using the multi-parallel test to test the smart card. In addition, the total testing time can be reduced.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A smart card comprising:
   a non-volatile memory storing a test program;
   a CPU (central processing unit); and
   a clock generator configured to generate a clock signal for driving the CPU in response to a power supply voltage that powers the smart card,
   wherein the CPU is released from a reset state in response to the power supply voltage, the CPU executes the test program stored in the non-volatile memory based on predetermined flag information and the clock signal, and the CPU stores a result of the test program in the non-volatile memory.

2. The smart card of claim 1, further comprising a flag cell to store the predetermined flag information, wherein the predetermined flag information is used by the CPU to determine a test mode of the non-volatile memory and the predetermined flag information is cleared by the CPU when the storage of the result has completed.

3. The smart card of claim 1, wherein the test program is a program for testing the non-volatile memory in a BIST (built-in self test) mode and the test program is stored in the non-volatile memory as rewritable code.

4. The smart card of claim 1, wherein the non-volatile memory is a flash electrically erasable and programmable ROM (EEPROM).

5. The smart card of claim 1, wherein the test program is stored in the non-volatile memory as rewritable code.

\* \* \* \* \*